(12) United States Patent
Moronuki

(10) Patent No.: US 6,821,497 B2
(45) Date of Patent: Nov. 23, 2004

(54) AMORPHOUS HARD CARBON FILM, MECHANICAL PARTS AND METHOD FOR PRODUCING AMORPHOUS HARD CARBON FILM

(75) Inventor: Masaki Moronuki, Saitama (JP)

(73) Assignee: Kabushiki Kaisha Riken, Tokyo (JP)

( * ) Notice: Subject to any disclaimer, the term of this patent is extended or adjusted under 35 U.S.C. 154(b) by 0 days.

(21) Appl. No.: 09/850,192

(22) Filed: May 8, 2001

(65) Prior Publication Data

US 2002/0022129 A1 Feb. 21, 2002

(30) Foreign Application Priority Data

May 9, 2000 (JP) ........................................ 2000-135366
Sep. 19, 2000 (JP) ........................................ 2000-283326

(51) Int. Cl.[7] .............................................. C01B 31/00
(52) U.S. Cl. ................ 423/415.1; 423/439; 423/445 R; 428/408
(58) Field of Search ................ 423/415, 439, 423/445 R; 428/408, 698, 701

(56) References Cited

U.S. PATENT DOCUMENTS

| | | | |
|---|---|---|---|
| 4,783,368 A | * | 11/1988 | Yamamoto et al. |
| 4,842,937 A | * | 6/1989 | Meyer et al. |
| 5,087,434 A | * | 2/1992 | Frenklach et al. |
| 5,266,409 A | * | 11/1993 | Schmidt et al. |
| 5,352,493 A | | 10/1994 | Dorfman et al. ............ 427/530 |
| 5,569,487 A | * | 10/1996 | DeVre et al. |
| 5,616,374 A | | 4/1997 | Sho ............................. 427/577 |
| 5,618,619 A | * | 4/1997 | Petrmichl et al. |
| 6,022,622 A | * | 2/2000 | Domoto et al. |

FOREIGN PATENT DOCUMENTS

| | | | |
|---|---|---|---|
| EP | 651069 | * | 5/1995 |
| EP | 0 724 022 A1 | | 7/1996 |
| RO | 366367 | | 8/1999 |
| WO | 97/14555 | | 7/1997 |

OTHER PUBLICATIONS

Dorfman, B. et al.; "Diamond–like Nanocomposite Coatings: Novel Thin Films"; *New Diamond and Diamond–like Films*; vol. 6, pp. 219–226; 1995.

Goel, A. et al., "Diamond–like Nanocomposite coatings (a–C:H/a–Si:O) for Tribological Applications"; *Diamond and Related Materials*; vol. 7, pp. 468–471; 1998.

Towe, M. et al., "Titanium Containing DLC Coatings From a PACVD Process Using Titanium (IV) Isopropylate as a Precursor"; *Diamond and Related Materials*; vol. 9, pp. 811–814; 2000.

\* cited by examiner

*Primary Examiner*—Archene Turner
(74) *Attorney, Agent, or Firm*—Kubovcik & Kubovcik (57) ABSTRACT

An amorphous hard carbon film has low friction coefficient from the beginning of sliding, when the metal oxide is contained in the film. The adhesion of the film to the substrate is also improved due to the low temperature treatment of RF plasma enhanced CVD method. This film can be applied to many sliding members, e.g., a piston ring, a vane of compressor and a plunger of fuel injection pump, used under severe condition.

3 Claims, 9 Drawing Sheets

AMORPHOUS HARD CARBON FILM, MECHANICAL PARTS AND METHOD FOR PRODUCING AMORPHOUS HARD CARBON FILM

BACKGROUND OF INVENTION

1. Field of Invention

The present invention relates to a protective coating applied to a sliding member and the like for the purpose of enhancing the wear resistance and decreasing the friction coefficient. More particularly, the present invention relates to hard carbon film as the protective coating and a method for producing the hard carbon film. Furthermore, the present invention relates to mechanical parts coated with an amorphous hard carbon film, used for automobiles and household electric appliances. In the present invention, the term "hard" is used in accordance with the general terminology of tribology (c.f. for example "Tribologist" (in Japanese) Vol. 44, No. 9, 1999, small special edition "hard materials"). Specifically, a sliding member harder than the opposite member, can be said to fulfill the hard property. Particularly, the hardness of hard film is Hv (Micro-Vickers Hardness Number) 1000 or more, more particularly Hv 1500 or more. Several examples of the amorphous hard carbon film applications are reviewed in Tribologist Vol. 41, No. 9, 1996, pages 760–771.

2. Description of Related Art

The conventional surface-treatment methods of metallic material for enhancing the wear resistance and scuffing resistance include nitriding, PVD (physical vapor deposition) and CVD (chemical vapor deposition). Metal carbide, e.g., TiC, or metal nitride, e.g., TiN, has been applied by the latter two methods as a hard film on the surface of the metallic material of a tool, metal die, and the like. Since these coating layers are as hard as Hv 2000–3000, but the friction coefficient lies in the range of from approximately 0.2 to 0.8 and is relatively high, sliding resistance with the opposite material increases according to circumstance. As a result, there arises problems of wear of the coating layer and damage of the opposite material.

The sliding members of the internal combustion engine of an automobile are exposed to severe sliding conditions, particularly an outer peripheral surface of a piston ring. A vane of a compressor and a plunger (piston) of a fuel injection pump are exposed to severe sliding conditions, too. The wear resistance required for these parts is, therefore, at a high level.

Heretofore, in order to ensure satisfactory sliding properties, particularly the wear resistance of these parts, high-grade wear-resistant materials are used and subjected to surface hardening treatment, such as nitriding and carburizing. However, the conventional method involves a problem in that it uses expensive material. In addition, since the surface hardening treatment must be carried out at high temperature of from several hundred degree C. to 1000° C., dimensional accuracy is lowered due to thermal deformation and the hardness of the substrate (work piece) material is also lowered.

The plunger of a fuel injection pump is operated under a poor lubricating gasoline environment. A composite plating with dispersed hard particles is, therefore, applied on a surface of the plunger. The heat treatment must be carried out at approximately 400° C. to enhance the hardness of the composite to the required level. High-grade material equivalent to SKD 11 (Cold Work Tool Steel) should, therefore, be used so as to avoid softening during the heat treatment. Under such circumstances, it has been desired to develop a method for forming wear resistant hard film at low temperature.

The amorphous hard carbon film formed by the CVD method with the aid of plasma or ion beam has high hardness in the range of from approximately 2000 to 3000 Hv. This film has attracted attention as the material of highly wear resistant coating. The amorphous hard carbon film may be referred to as a diamond-like carbon film, i-carbon film, hydrogenated amorphous carbon film (a-C:H) and the like. Each of these films mainly comprises amorphous carbon.

Although applications of such amorphous hard carbon film to sliding members have been considered, the inherently large compressive stress in the film reduces adhesion of the film to the substrate material and makes a thick coating of the film impossible.

It has been proposed to enhance the adhesion of the amorphous hard carbon film to the substrate by means of sandwiching between the substrate and the film an intermediate layer consisting of metal, metal nitride and metal carbide. For example, Japanese Examined Patent Publication No. 5-82472 discloses the use of carbide, carbo-nitride, oxy-carbide, carbo-oxy-nitride and carbo-boride of 4a, 5a and 6a family metal of Periodic Table, as well as carbide or carbo-nitride of Si as the intermediate layer. Japanese Unexamined Publication No. 10-130865 discloses an intermediate layer, which mainly comprises at least one metal element or its oxide, nitride or carbide selected from the group consisting of Al, Cr, Sn, Co. However, these proposals to improve the adhesion are connected with the intermediate layers rather than the surface layers which are directly involved in the sliding.

Surface Coating Technology, 47, 710–721 (1991) and Japanese Unexamined Patent Publication No. 3-240957 (Japanese Patent No. 2971928) discloses that low friction coefficient is obtained due to the adsorption of environmental gas to the silicon oxide ($SiO_2$) formed on the sliding surface of an amorphous hard carbon-hydrogen-silicon film. Note that this silicon oxide is formed on the surface of the hydrogenated amorphous carbon film, which preliminarily contains Si in the film, during its sliding with the opposite member. In other words, silicon oxide is not present in the film from the beginning. The friction coefficient is, therefore, high at the beginning of sliding, and a prolonged time is necessary to attain a low level of friction coefficient.

SUMMARY OF INVENTION

It is, therefore, an object of the present invention to overcome the problems involved in the prior art and to provide an amorphous hard carbon film having high hardness low friction coefficient and good adhesion.

It is an another object of the present invention to provide mechanical parts, which are coated with an amorphous hard carbon film containing metal oxide on the sliding surfaces.

It is a further object of the present invention to provide an amorphous hard carbon film which contains metal oxide and which attains stably low friction coefficient from the beginning of sliding. Incidentally, the conventional amorphous carbon film cannot exhibit such friction coefficient from the beginning.

It is yet an object of the present invention to provide a method for producing the amorphous hard carbon film having the properties described above. A method for forming the amorphous hard carbon film on sliding surface of the mechanical parts according to the present invention should be such that high temperature is unnecessary.

The amorphous hard carbon film according to the present invention mainly comprises carbon and hydrogen and is characterized by containing metal oxide in the film. The metal oxide may be an oxide of at least one element selected from the group consisting of Si, Ti, B and W. The content of oxygen in the film is preferably from approximately 0.1 to 10 atomic %.

The amorphous carbon film, which comprises mainly carbon hydrogen and metal oxide, can be formed by means of introducing carbon material, metal-containing material and oxygen into a vacuum chamber, in which a substrate is placed.

The amorphous carbon film according to the present invention exhibits high hardness, improved wear resistance, and low friction coefficient. The amorphous carbon film according to the present invention can, therefore, be applied to the mechanical parts which have a sliding portion and are operated under conditions where lubrication is difficult.

The minor components of the amorphous hard carbon film according to the present invention are mainly oxide and contain fluorine, bromine, chlorine and the like contained in the starting materials in addition to a small amount of oxygen not combined as the oxide, and metallic elements.

In the present invention, the main components, i.e., carbon and hydrogen, form an amorphous structure detected by the Ar-laser Raman spectroscopy. Excellent sliding property is attributable to the amorphous structure. The metal oxide may be crystalline or amorphous.

In the present invention, the opposite member is a cylinder or cylinder liner made of cast iron or aluminum alloy in the case where the sliding member is a piston ring. The opposite members are a rotor or housing made of aluminum or iron for a vane of compressor, and a cylinder made of material equivalent to SKD 11 for a plunger of the fuel injection pump. These are non-limiting examples, and the amorphous hard carbon film according to the present invention can be embodied as any member, provided that the sliding properties of such film can be utilized.

The hardness of the amorphous hard carbon film according to the present invention is fundamentally determined by the hydrogen content of the film. When the hardness is Hv 1800 or less, the wear resistance is poor. On the other hand, when the hardness is Hv 2500 or more, the film is brittle. The hardness is, therefore, preferably from Hv 1800 to 2500. More preferably, the hardness is from Hv 1900 to 2400. When the film is thinner than 2 $\mu$m, the wear resistance is unsatisfactory. On the other hand, when the film is thicker than 15 $\mu$m, the film is liable to peel off under stress. The film is, therefore, preferably from 5 to 10 $\mu$m thick.

Hereafter, the portions of a sliding member, on which the amorphous high carbon film is formed, are described. In the case of a piston ring, the film is formed on at least the outer peripheral surface. It is applied for the entire surface of the side rail and the ear portion of the spacer expander for a three piece type oil control piston ring, too. In the case of a vane of a compressor, the film is formed on one or more of the round top surface and side surface of the vane. In the case of a plunger of a fuel injection pump, the film is formed on at least the outer peripheral surface of the plunger. The substrate material of a piston ring, a vane, a plunger and the like may be made of conventional materials. The amorphous hard carbon film, which contains metal oxide according to the present invention, may be directly applied on the underlying metal or may be formed on such films as a nitriding layer, a Cr plating film, an Ni—Co—P composite plating film, in which hard particles, e.g., silicon-nitride particles, are dispersed, and an ion-plating film of CrN, TiN and the like.

The amorphous carbon, which mainly comprises carbon and hydrogen and which contains metal oxide, can be formed by means of introducing carbon material, metal-containing material and oxygen into a vacuum chamber, in which a sliding member is placed. The film-forming technique may be the RF plasma enhanced CVD method, the ion-beam evaporating method, and the vacuum-arc method. An example of the RF plasma enhanced CVD method is hereinafter described.

Hydrocarbon gases such as methane, acetylene and the like can be used as the carbon material. Tetramethylsilane, tetraethylsilane, tetraethoxysilane, tetramethoxysilane, triethoxyboron, boron fluoride, tetra-i-propoxy titane, hexafluoride tungsten and the like can be used as the metal-containing materials.

Incidentally, the sliding member should undergo no heating during the film formation. Although the temperature of sliding member is elevated while being exposed to plasma, its temperature is kept 200° C. or less.

OXYGEN IN AMORPHOUS HARD CARBON FILM

A metallic element, such as Si, Ti and W, which easily forms stable carbide, is added into the amorphous hard carbon film. As a result, the adhesion of the film to the iron-based substrate can be improved. Oxygen is added in the plasma during the film formation so as to form a metal oxide in the amorphous hard carbon film. Alternatively, starting materials, which contain the oxygen and the metal in advance, may be used. When Si is added in the amorphous hard carbon film, oxide in the form of $SiO_2$ is formed in the film. As is known, the inherent friction coefficient of $SiO_2$ is as high as approximately 1.0. When the contamination lubrication phenomenon occurs due to adsorption of environmental gas, the friction coefficient of $SiO_2$ is decreased to approximately 0.25. Since a trace amount of metal oxide is present not only on the top surface of the amorphous hard carbon film but also in the inside of the film, the contamination lubrication phenomenon occurs from the beginning of sliding and is maintained during sliding to stably keep low friction coefficient.

The amorphous hard carbon film, which contains metal oxide and is formed on the surface of a sliding member, is firmly adhered to the sliding member. The film is hard and its friction coefficient is low. The amorphous hard carbon film, which contains metal oxide, is formed on a portion of the sliding member in sliding or thrusting contact with the opposite member. Thus, the wear resistance of the sliding member is improved even under severe conditions.

The amorphous hard carbon film according to the present invention is different from the conventional one in the point of containing metal oxide. The friction coefficient according to the present invention is lower than the level heretofore obtained. It is believed that this characteristic property is attributable to the following. In silicon containing amorphous hard carbon film, its film hardness and friction coefficient are dependent upon the content of carbon, hydrogen and silicon, and the bonding state of them in the film. Paying attention to the bonding state, carbon atoms are bonded with one another or with the hydrogen atoms, so that sp2 bond (the graphite structure) and sp3 bond (diamond structure) are found. The structure of the amorphous hard carbon film of the present invention according to that determined by the Ar laser Raman spectroscopy is expressed in terms of a broad G (graphite) peak in the vicinity of wavelength 1550 $cm^{-1}$ and sub D (disordered) peak in the vicinity of wavelength 1400 $cm^{-1}$. The sp2 bond and the sp3 bond, i.e., the graphite structure and the diamond structure, respectively, are mixed.

Regarding the bonding state of elementary silicon in the film, it is bonded with carbon and forms stable carbides. There seems to be, however, a possibility that the partly unbonded electrons are left as dangling bond, which makes the film structurally unstable. The hardness and friction coefficient of the film are apparently to be influenced by the dangling bond. Any dangling bond in the film may undergo a chemical reaction due to mutual reaction between the bond and ambient atmosphere, when the wear is advanced to such an extent that the inside of the film is exposed to ambient atmosphere during the sliding. The chemical reaction may be an oxidation in the case of the ambient atmosphere. The reaction would advance until the surface of the film is changed to a chemically stable state. The present invention is based on the analysis of the prior art as described above and proposes to incorporate a trace amount of oxygen into the amorphous hard carbon film with the added metal element during the film formation in plasma. The trace amount of oxygen is bonded with the metal element, which is not yet fixed by carbon in the form of a stable carbide. The resultant oxide is in a stable bonding state.

Although the silicon oxide is described in the preceding paragraph, Ti added in the amorphous hard carbon film is bonded with carbon to form TiC, while unbonded Ti may remain in the film to be subjected to oxidation. The same effects as described above can be expected in this case.

The amorphous hard carbon film according to the present invention involves the concept described above and exhibits both low friction property attributable to the graphite structure and high hardness property attributable to the diamond structure and the Si—C bond. In addition, the film according to the present invention exhibits stable low frictional property attributable to the stable bond structure due to the addition of trace oxygen.

Figure 11:
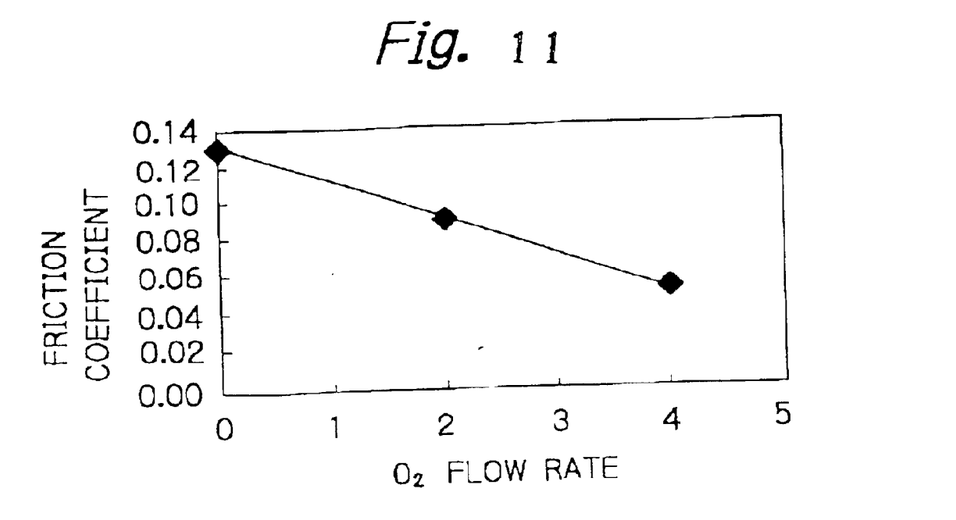
FIG. 11 is a graph showing the relationship between the oxygen flow-rate and the coefficient of friction.

FIG. 11 shows the effect of oxygen addition on the friction coefficient of the amorphous hard carbon film. The friction coefficient decreases even by addition of oxygen in small amount. Such film is investigated by the X-ray photoelectron spectroscopy to determine the content and the bonding state of silicon in the film. The silicon content is 4 atomic % or less and mainly bonded with carbon to form the Si—C bond. A part of silicon is bonded with oxygen and is in the form of $SiO_x$. It is considered that the silicon oxide is effective for decreasing the friction coefficient.

EXAMPLES

The following is a procedure of producing the amorphous hard carbon film according to the present invention. A substrate is placed in a vacuum chamber and evacuation is carried out to attain a pressure of, for example, 5.25E-8 Pa (7E-6 torr) or less. Subsequently, Ar gas is introduced into the vacuum chamber, while the evacuation is kept continuing. Direct current power or high frequency power is applied to the substrate to activate the plasma discharge in the vacuum chamber and hence to clean the substrate surface by plasma. After stopping the inflow of Ar gas, the carbon material, the metal-containing material, and the oxygen are introduced into the vacuum chamber, in which the substrate is placed. The plasma discharge is, then, activated to form on the substrate an amorphous hard carbon film containing metal oxide. Hydrocarbon gases such as methane and acetylene can be used as the carbon material. Tetramethylsilane ($Si(CH_3)_4$), tetraethylsilane ($Si(C_2H_5)_4$), tetramethoxysilane ($Si(OCH_3)_4$), tetraethoxysilane ($Si(OC_2H_5)_4$), triethoxyboron ($B(OC_2H_5)_3$), tetra-i-propoxytitanium ($Ti(OCH(CH_3)_2)_4$), hexafluoridetungsten ($WF_6$) and the like can be used as the metal-containing materials.

Appropriate pressure within the vacuum chamber is from 7.5E-6 to 7.5E-5 Pa (1–10 mTorr).

Examples of the present invention are described.

Example 1

Addition of Oxygen

Figure 1:
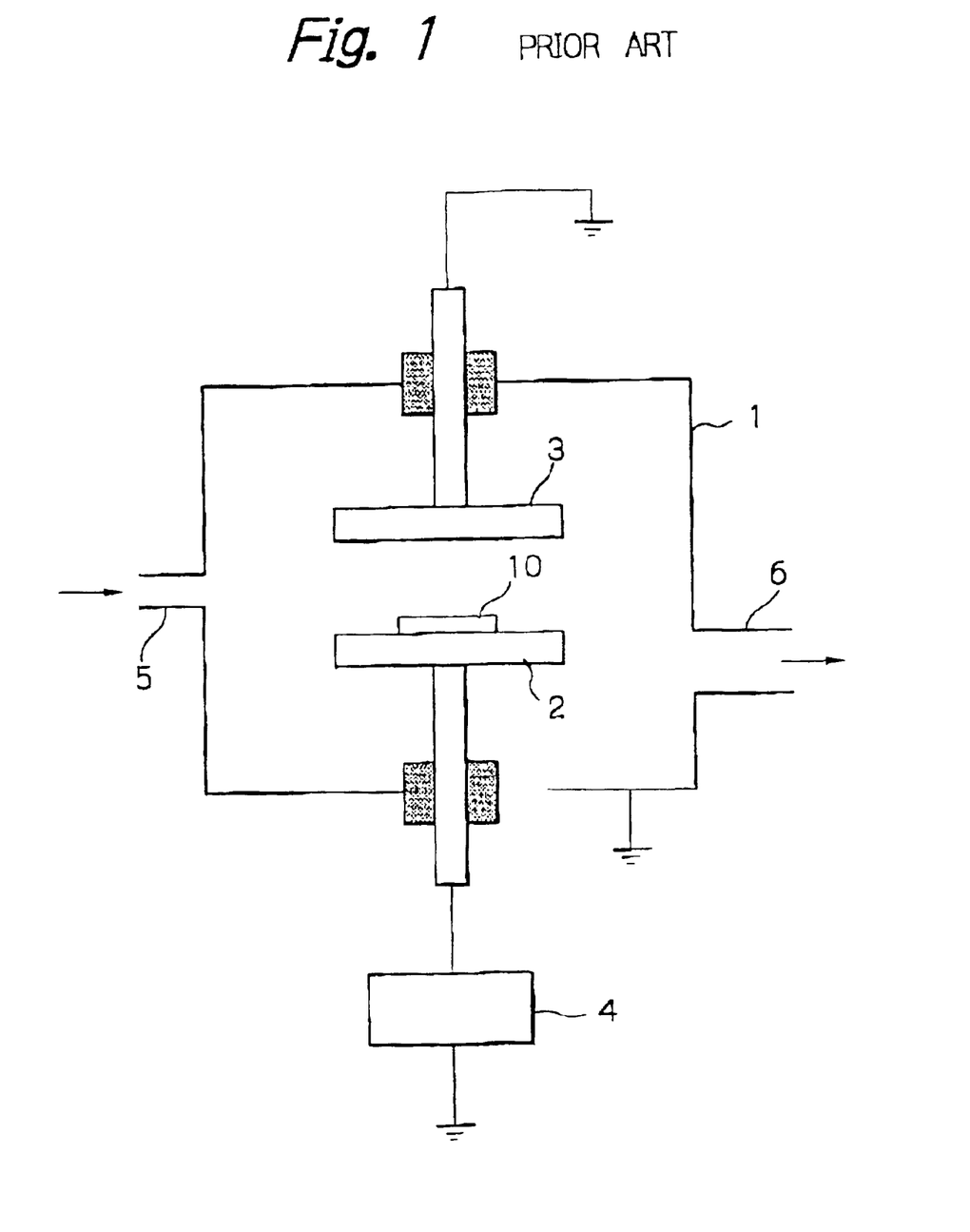
FIG. 1 schematically illustrates the RF plasma enhanced CVD apparatus used in the present invention.

The substrate used was mirror-polished SKH 51. Amorphous hard carbon film was formed on the substrate by the RF plasma enhanced CVD method and its evaluation test was carried out. The RF plasma enhanced CVD method used for forming the film is schematically shown in FIG. 1.

A pump (not shown) was connected to the evacuation port 6 of the vacuum chamber 1 and was operated to evacuate it to 5.2E-8 Pa or less. Ar gas was then introduced through the gas-inlet 5 and the pressure was controlled to 7.5E-5 Pa. High frequency power of 300W was applied through the RF power source 4 between the lower electrode 2 and the upper electrode 3 to generate plasma between those electrodes. The work piece (the substrate) 10 was placed on the lower electrode 2 and was cleaned by the Ar plasma for a predetermined time. The high-frequency power source was then turned off to stop the plasma discharge. The supply of Ar gas was terminated. Acethylene, tetramethylsilane and oxygen were introduced through the gas-inlet 5 into the vacuum chamber 1. The partial pressure ratio of their gases was adjusted to $C_2H_2$:TMS:$O_2$=8.5:1:0.5. The total pressure was adjusted to 5.25E-5 Pa. After the pressure was stabilized, the RF power source 4 was, then, turned on to apply 100W of high-frequency power to generate plasma. The film formation by plasma was carried out for approximately 60 minutes. An approximately 1 μm thick black film was formed on the work piece (substrate) 10.

Figure 2:
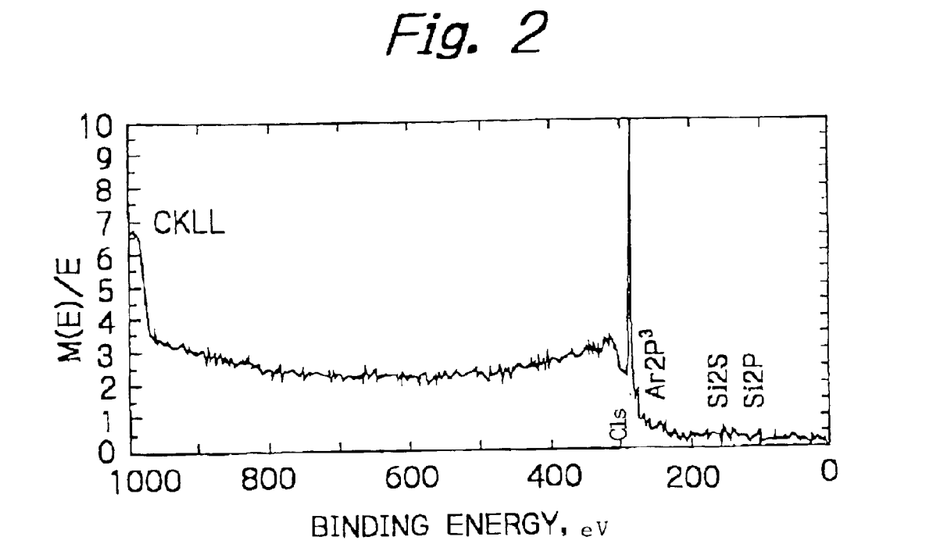
FIG. 2 shows an XPS analysis result of the all elements of the amorphous hard carbon film according to the present invention.
Figure 3:
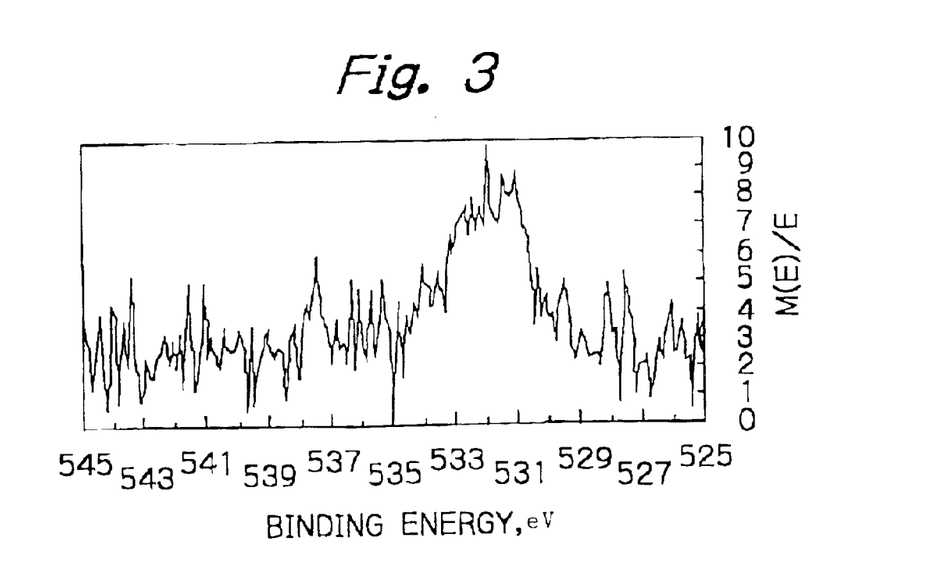
FIG. 3 shows an XPS analysis result of the oxygen element of amorphous hard carbon film according to the present invention.

The formed black film was subjected to the laser Raman spectroscopy. As a result, it was confirmed that the film was typical amorphous diamond-like carbon. Inside of the film was further analyzed by XPS. FIG. 2 shows the XPS analytical results of the whole elements of the film. The peaks of C1s, Si2p and Si2s were detected at the binding energy of 284 eV, 100 eV and 150 eV, respectively. FIG. 3 shows the analytical results of the bonding state of oxygen in the vicinity of wavelength 530 eV. Since the peak wavelength of oxygen is 532 eV, the formation of $SiO_2$ was confirmed. Table 1 shows a composition obtained by XPS analysis. The composition indicates the formation of $SiO_2$ in the film.

TABLE 1

| Starting Materials | Film Composition (at % except for Hydrogen) | | |
|---|---|---|---|
| (gas) | Carbon | Silicon | Oxygen |
| Example 1    $C_2H_2$,TMS,$O_2$ | 96.4 | 2.55 | 1.01 |

The frictional property of the amorphous hard carbon film formed on the work piece (substrate) was evaluated by a ball-on-disc test. A SUJ 2 ball of 6 mm in diameter used as the opposite material was pressed on the film at 10N of load, under no lubrication and at room temperature and was slid on the film at 10 mm/sec of speed. The total sliding distance amounted to 20 m. The results are shown in Table 2.

Comparative Example

In order to facilitate the comparison with the present invention, the film formation was carried out only by using acetylene without the addition of tetramethylsilane and oxygen The procedure of film formation, the pressure in the chamber and the like were same as in Example 1. The results of the measurement of film thickness and the frictional property are shown in Table 2.

Example 2

Use of Oxygen-Containing Compound

The film formation was carried out under the same conditions as in Example 1 except that tetraethoxysilane (TEOS, $Si(OC_2H_5)_4$) was used in place of oxygen. The partial pressure ratio of the gases was adjusted to $C_2H_2$:TMS:TEOS=8:1:1. The total pressure was adjusted to 5.25E-5 Pa. The XPS analysis indicated the formation of $SiO_2$ in the film as in Example 1.

TABLE 2

| No of Samples | Film Thickness ($\mu$m) | Friction coefficient |
|---|---|---|
| Example 1 | 1 | 0.05 |
| Example 2 | 1 | 0.05 |
| Comparative Example 1 | 1 | 0.2 |

It is apparent from the comparison of the friction coefficient in Table 2 that it is high in the case where no oxide such as $SiO_2$ is present in the film. In Examples 1 and 2, in which $SiO_2$ is present in the film, the friction coefficient is 0.05 and hence low.

Example 3

Piston Ring

Figure 4:
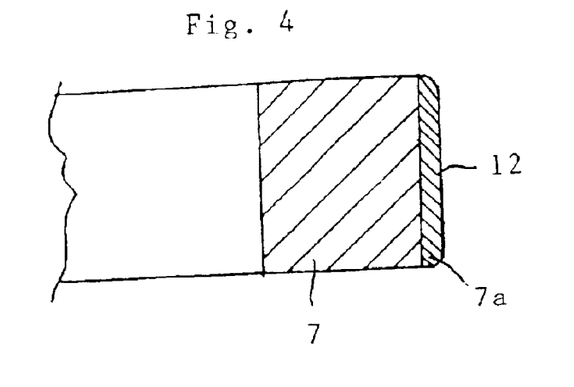
FIG. 4 is a cross sectional drawing of a piston ring, to which the present invention is applied. The amorphous hard carbon film is formed on the outer peripheral surface.
Figure 5:
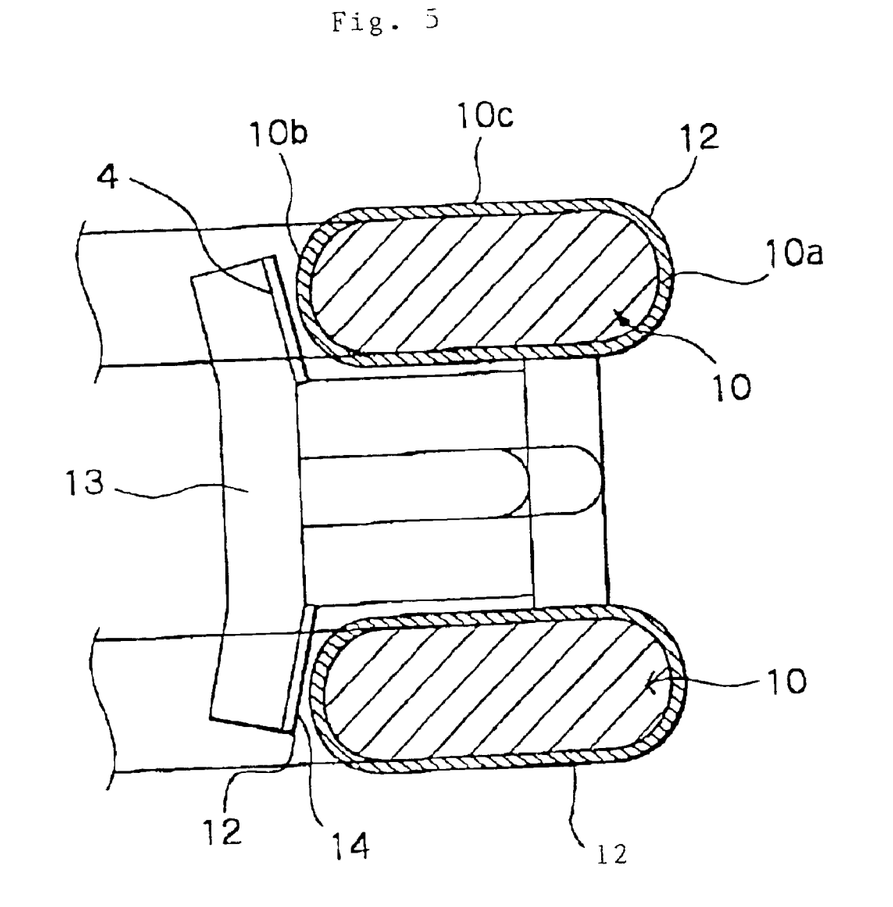
FIG. 5 is is a cross-sectional drawing of a three piece type oil control piston ring, to which the present invention is applied.

FIG. 4 shows an example of a piston ring, to which the present invention is applied. FIG. 5 also shows an example of a three piece type oil control piston ring, to which the present invention is applied. The amorphous hard carbon films 12 with the right hand down hatching is formed on the outer peripheral surfaces 7a and 10a, the inner peripheral surface 10b and the side surface 10c of the piston ring 7 and the rail 10 of the three piece type oil control piston ring. In addition, the amorphous hard carbon film 12 is also formed on the ear portion 4 of the spacer expander 13, where it is brought into contact with the rail 10. The amorphous hard carbon film 12 is formed by the plasma enhanced CVD method and contains the metal oxide as described above.

Figure 8:
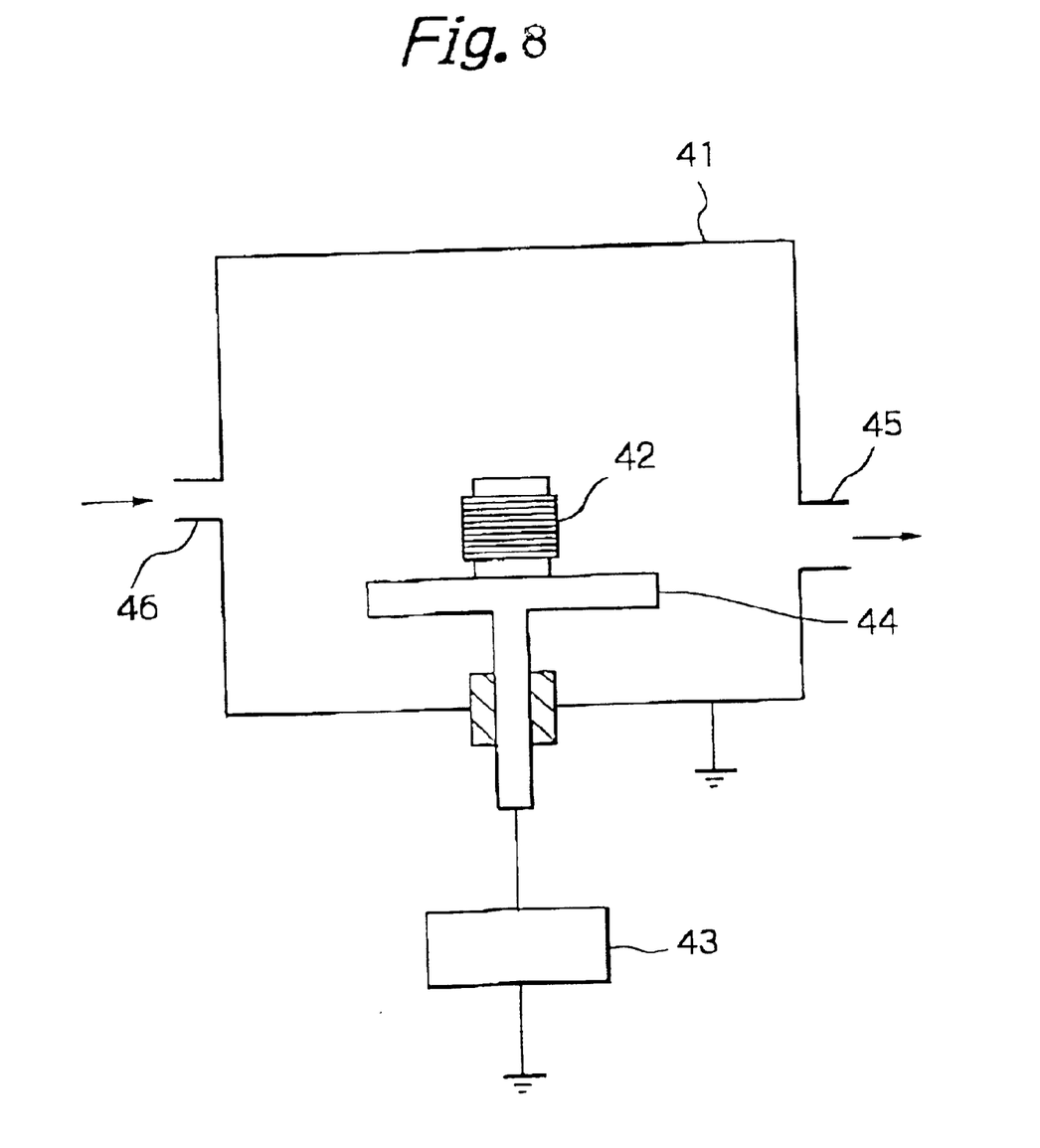
FIG. 8 schematically shows an another RF plasma enhanced CVD apparatus used in the present invention to form the amorphous hard carbon film according to the present invention.

Piston rings 42 to be subjected to nitriding and cleaning in advance were placed on the electrode plates 44 electrically connected with the RF power source 44 shown in FIG. 8. A pump (not shown) connected to the evacuation port 45 of the vacuum chamber 41 was operated to evacuate it until approximately 5.25E-8 Pa or less. Ar gas was then introduced through the gas-inlet 46 and the pressure was controlled to approximately 7.5E-5 Pa. High frequency power was applied through the RF power source 4 to the piston rings 42 to induce the plasma discharge, thereby cleaning the surface of piston rings. The supply of Ar gas was then terminated. The carbon material (acetylene), the metal-containing material (tetramethylsilane), and the oxygen were introduced into the vacuum chamber 41. The RF power was again applied to induce the plasma discharge. The amorphous hard carbon films formed on the piston rings 42 contained metal oxide ($SiO_2$).

TABLE 3

| | | Example 3 O2 Addition | Comparative Example 2 Nitriding | Comparative Example 3 Nitiding + Cr Plating | Comparative Example 4 Without $O_2$ Addition |
|---|---|---|---|---|---|
| Cleaning | Ar Flow Rate (sccm) | 10 | | | 10 |
| | Pressure (Pa) | 750E-05 | | | 750E-05 |
| | RF Power (W) | 300 | | | 300 |
| Film Formation | $C_2H_2$ Flow Rate (sccm) | 30 | | | 30 |
| | TMS Flow-Rate (sccm) | 1 | | | 1 |
| | $O_2$ Flow Rate (sccm) | 4 | | | 0 |
| | Pressure (Pa) | About 1.5E-4 | | | About 1.5E-4 |
| | RF Power (W) | 100 | | | 100 |

No intentional heating of piston rings was carried out during the film formation. Since the piston rings were exposed to plasma, electrons and ions of plasma collided against (impinged on) the piston rings and a temperature rise occurred. However, the temperature of the piston rings did not exceed 200° C. under the conditions shown in Table 3.

Figure 9:
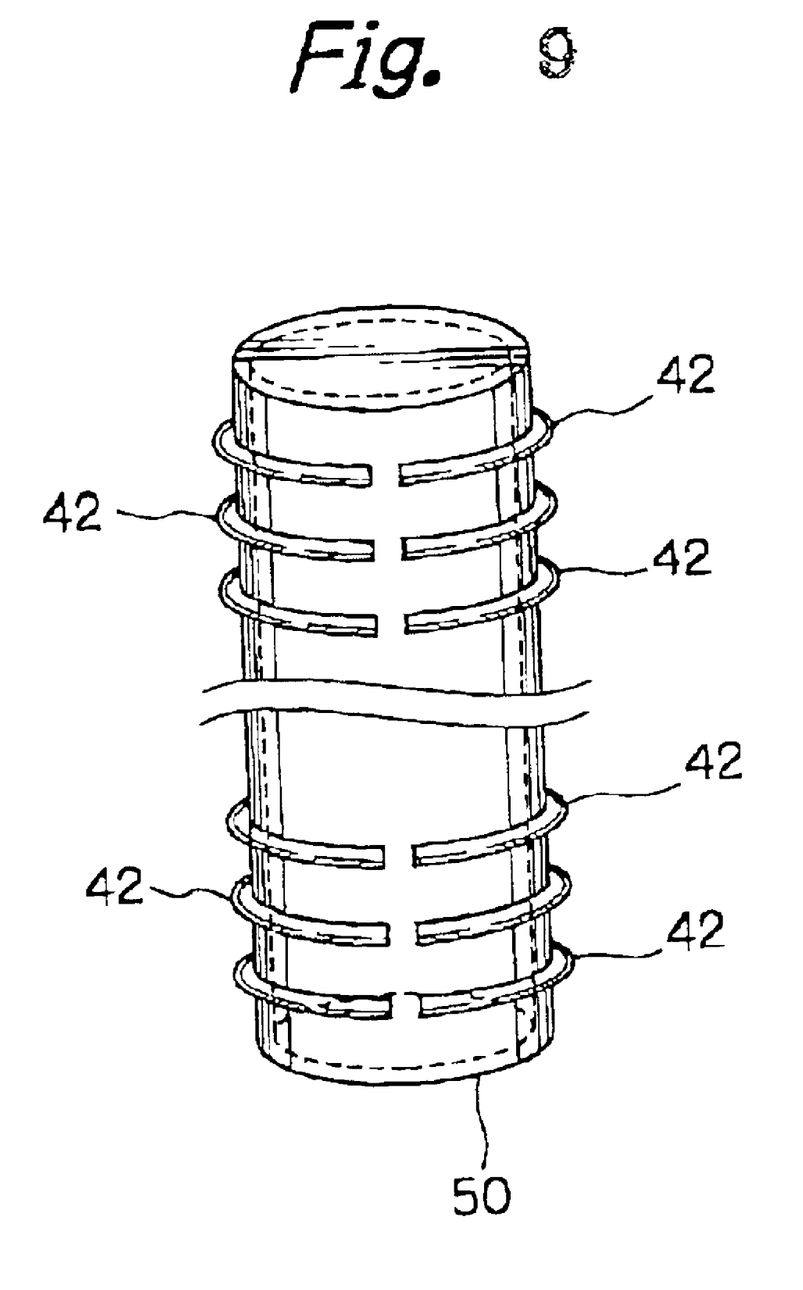
FIG. 9 illustrates a method for forming the amorphous hard carbon film on the outer peripheral surfaces of piston rings.
Figure 10:
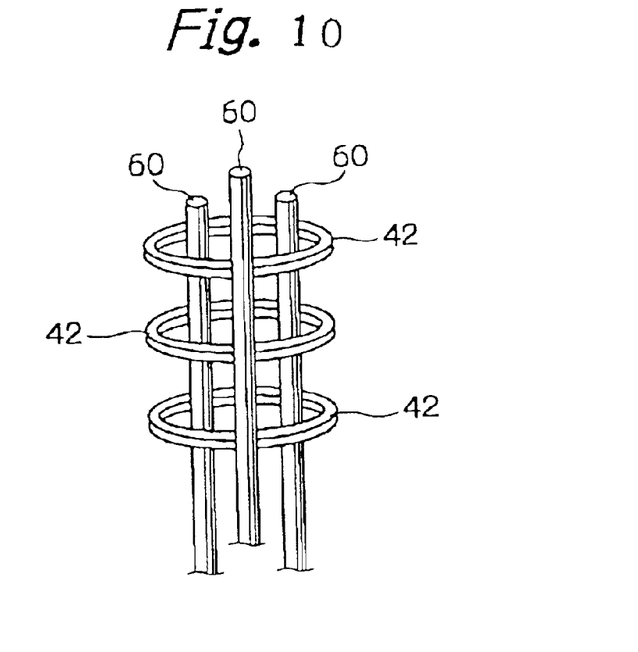
FIG. 10 illustrates another method for forming the amorphous hard carbon film on the outer peripheral, side and inner peripheral surfaces of piston rings.

When the piston rings 42 were stacked on the electrode plate 44 in FIG. 8, the amorphous hard carbon film was formed only on the outer peripheral surface. On the other hand, in the case that the piston rings 42 are wound around the cylindrical jig 50 shown in FIG. 9 in such a manner that there is a constant vertical interval between them, the amorphous hard carbon film can be formed on the outer peripheral and side surfaces. Furthermore, in the case that the piston rings 42 are supported using three rods 60 shown in FIG. 10, the amorphous hard carbon film can be formed on the outer peripheral surface, the side surface and the inner peripheral surface (except for the portions behind the rods 60).

Figure 12:
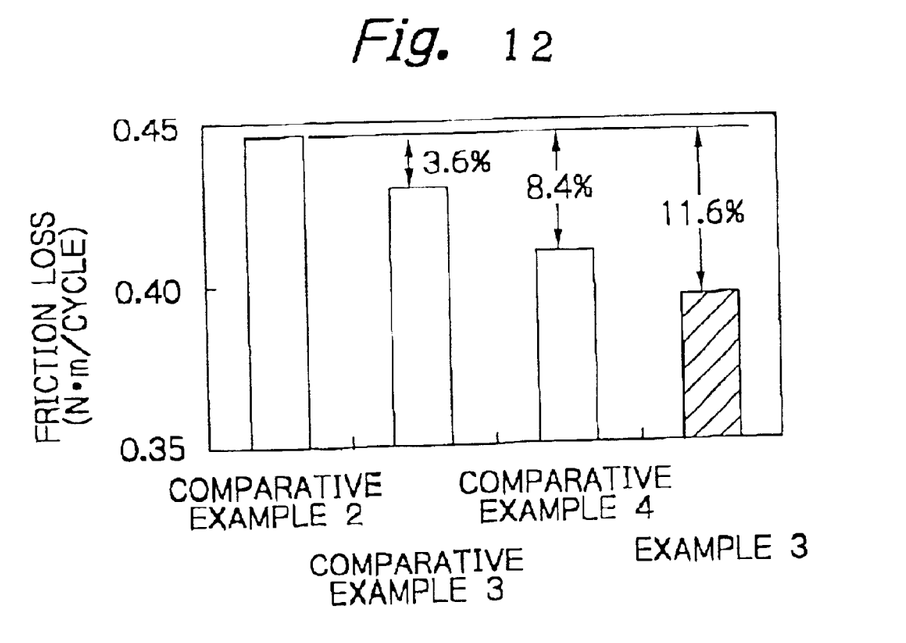
FIG. 12 is a graph showing the friction loss in an example of the present invention and comparative examples.

The piston rings subjected to the film formation as shown in FIG. 8 were tested, by the motoring test to measure friction loss. The opposed material was a cylinder liner made of FC250. The rotational frequency was 100 rpm and low-viscosity oil (40° C., 5cSt) was used. The results are shown in FIG. 12.

Comparative Example 2

The piston rings used in Example 3 were subjected to nitriding treatment but not to further film formation for the comparison purpose. The friction loss was evaluated under the same conditions as in Example 3. The results are shown in FIG. 12 together with the Example 3 and other comparative examples

Comparative Example 3

The piston rings used in Example 3 were subjected to nitriding treatment and then chromium plating of approximately 20 μm thickness for the comparison purpose. The friction loss was evaluated under the same conditions as in Example 3. The results are shown in FIG. 12 together with the Example 3 and other comparative examples.

Comparative Example 4

The amorphous hard carbon film 10 μm in thickness was formed on the outer peripheral surface of piston rings by the same method as in Example 3, except that oxygen was not added during the film formation. In this film, silicon was present exclusively in the form of carbide. The friction loss was evaluated under the same conditions as in Example 3. The results are shown in FIG. 12 together with the Example 3 and other comparative examples.

As is apparent from FIG. 12, the friction loss of the piston rings according to Example 3 is less by 11.6% than that of the piston rings with only nitriding (Comparative Example 1). The friction loss of Example 3 is less by approximately 8% than even that of the piston ring with nitriding and chromium-plating (Comparative Example 3). The friction loss of Example 3 is less by approximately 3.2% than that of the amorphous hard carbon film according to Comparative Example 4, in which silicon is present exclusively in the form of carbide due to no addition of oxygen. In the amorphous hard carbon film, which contains silicon, a part of silicon is not bonded in the form of carbide. Such silicon is subjected to oxidation by means of addition of oxygen in trace amount into the amorphous hard carbon film. The silicon oxide is chemically stable. The resultant amorphous hard carbon film demonstrates the lower friction coefficient and hence less friction loss than those of the amorphous hard carbon film without silicon oxide.

Example 4

Vane

Figure 6:
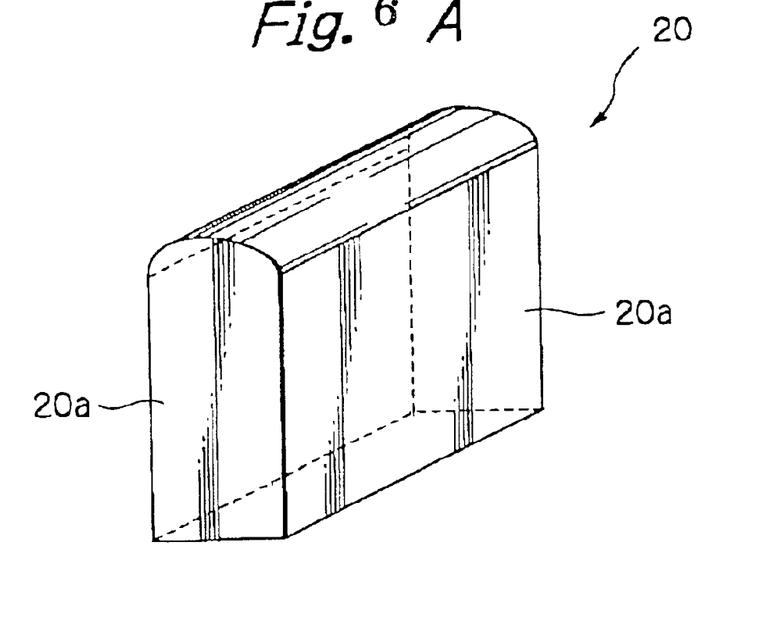
FIG. 6A is an oblique perspective view of a compressor-vane, to which the present invention is applied.
FIG. 6B is a cross-sectional view of the vane.

FIG. 6A shows the oblique perspective view of a vane 20 (material is SKH51) of a compressor. FIG. 6B shows the cross-section of the vane 20. The amorphous hard carbon film 12, which contains silicon oxide, is formed on the round top surface 20b and four side surfaces 20a. The silicon oxide was incorporated into the amorphous hard carbon film 12 by the RF plasma enhanced CVD method described above. Table 4 shows the production conditions of Example 4 and the other comparative examples.

TABLE 5

|  |  | Example 4 | Comparative Example 5 SKH51 | Comparative Example 6 | Comparative Example 7 |
|---|---|---|---|---|---|
|  | Material Treatment | $O_2$ Addition | No Treatment (SKH51) | IP-CrN | No $O_2$ Addition |
| Cleaning | Ar Flow Rate (sccm) | 10 |  |  | 10 |
|  | Pressure (Pa) | 750E-05 |  |  | 750E-05 |
|  | RF Power (W) | 300 |  |  | 300 |
| Film Formation | $C_2H_2$ Flow Rate (sccm) | 30 |  |  | 30 |
|  | TMS Flow-Rate (sccm) | 1 |  |  | 1 |
|  | $O_2$ Flow Rate (sccm) | 4 |  |  | 0 |
|  | Pressure (Pa) | About 1.5E-4 |  |  | About 1.5E-4 |
|  | RF Power (W) | 100 |  |  | 100 |
| Friction Coefficient |  | 0.05 | 0.1 | 0.1 | 0.1 |

Figure 13:
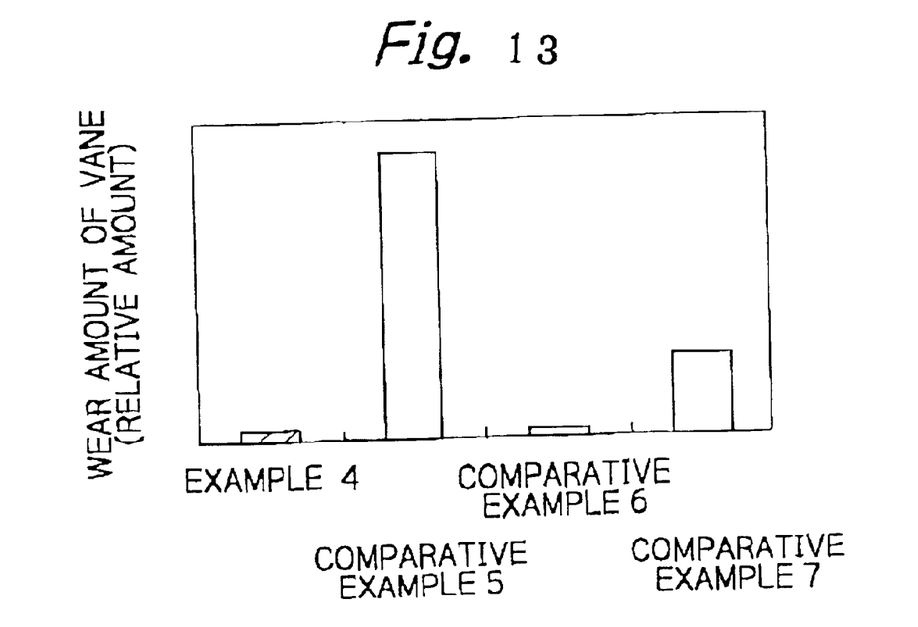
FIG. 13 is a graph showing the wear amount of a vane in an example of the present invention and comparative examples

Vanes 20 (their bottom surface 20c is directed downward) are placed in a constant distance on the electrode plate 44 in the apparatus shown in FIG. 8. The amorphous hard carbon film was thus formed on the round top surface 20b and the four side surfaces of the vanes 20 except for the bottom surface 20c. The so-treated vanes were evaluated by a wear-resistant test under the following conditions: the opposite material—FC250; sliding speed—0.5 m/sec; lubrication—oil lubrication (motor oil, product of Nisseki Motor Oil P20); temperature—100° C.; and, test time 4 hours. The results are shown in FIG. 13.

Comparative Example 5

For the comparison purpose, the vanes made of SKH 51 used in Example 4 were not subjected to surface treatment. The test result of wear resistance is shown in FIG. 13 together with the Example 4 and other comparative examples.

Comparative Example 6

The vanes made of SKH 51 used in Example 4 were subjected to ion plating to form an approximately 5 μm thick CrN film. The test result of wear resistance is shown in FIG. 13 together with the Example 4 and other comparative examples.

Comparative Example 7

The amorphous hard carbon film 10 μm in thickness was formed on the vanes by the same method as in Example 4, except that oxygen was not added during the film formation. In this film, silicon was present exclusively in the form of carbide. The test result of wear resistance is shown in FIG. 13 together with the Example 4 and other As is apparent from FIG. 12, the wear amount of SKH51 without surface treatment (Comparative Example 5) is the greatest and that of the amorphous hard carbon film without addition of oxygen (Comparative Example 7) is the next. The wear amount of Example 4 is as small as the ion-plated CrN (Comparative Example 6).

In addition, referring to Table 4, the friction coefficient of Example 4 is lower than that of comparative examples.

In the amorphous hard carbon film, which contains silicon, a part of silicon is not bonded in the form of carbide.

Such silicon is subjected to oxidation by means of addition of oxygen in trace amount into the amorphous hard carbon film. The silicon oxide is chemically stable. The lower friction coefficient and hence less friction loss than that of the amorphous hard carbon film without silicon oxide.

Example 6

Plunger

Figure 7:
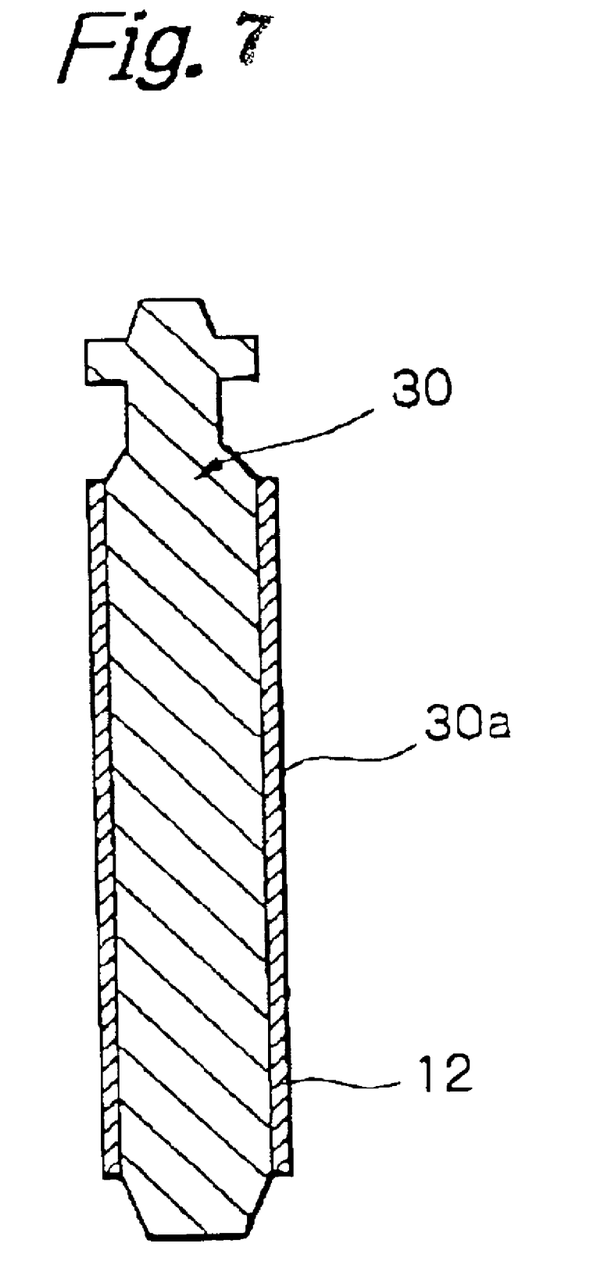
FIG. 7 is a cross-sectional view of a plunger of the fuel injection pump, to which the present invention is applied.

FIG. 7 shows a cross-section of a plunger 30 (material is equivalent to SKD11) of the fuel injection pump. The amorphous hard carbon film 12, which contains silicon oxide, is formed on the outer cylindrical surface of the plunger. The silicon oxide was incorporated into the amorphous hard carbon film 12 by the RF plasma enhanced CVD method described above.

Plungers 30 are vertically arranged at constant intervals on the electrode plate 44 in the apparatus shown in FIG. 8 while the top end is supported by a jig (not shown). A 10 μm thick amorphous hard carbon film 12, which contains silicon oxide, was formed on the outer peripheral surface of the plungers 30. The scuff resistance of the so treated plungers was evaluated under gasoline environment and the following conditions: sliding speed —8 m/second; and, load—250 MPa max.

TABLE 5

| | | Example 5 | Comparative Example 8 | Comparative Example 9 | Comparative Example 10 |
|---|---|---|---|---|---|
| | Material Treatment | $O_2$ Addition | No Treatment (SKD 11) SKD11 | Ni-Co-P Plating | No $O_2$ Addition |
| Cleaning | Ar Flow Rate (sccm) | 10 | | | 10 |
| | Pressure Pa | 7.50E.05 | | | 7.50E-0.5 |
| | RF Power (W) | 300 | | | 300 |
| Film Formation | $C_2H_2$ Flow Rate (sccm) | 30 | | | 30 |
| | TMS Flow-Rate (sccm) | 1 | | | 1 |
| | $O_2$ Flow Rate (sccm) | 4 | | | 0 |
| | Pressure (Pa) | About 1.5E-4 | | | About 1.5E-4 |
| | RF Power (W) | 100 | | | 100 |
| | Scuff Load (MPa) | 25> | 10 | 20 | 22 |

Comparative Example 8

For the comparison purpose, the plungers made of SKD 11 used in Example 5 were prepared and subjected to no surface treatment. The scuff resistance test was conducted by the method of Example 5. The results are shown in Table 5.

Comparative Example 9

For the comparison purpose, an Ni—Co—P plated film containing B was formed on the outer peripheral surface of the plungers 30 used in Example 5 by the composite dispersion plating. The scuff resistance test was conducted by the method of Example 6. The results are shown in Table 5.

Comparative Example 10

The amorphous hard carbon film 10 μm in thickness was formed on the plungers by the same method as in Example 5, except that oxygen was not added during the film formation. In this film, silicon is present exclusively in the form of carbide. The test result of scuff resistance is shown in Table 5 together with the Example 5 and other comparative examples.

As is apparent from Table 5, the scuffing occurs at approximately 10 MPa in the case of the SKD 11 plunger without wear resistant film. In the case of the Ni—Co—P plated film containing B, the scuffing occurs at approximately 20 MPa. In the case of the amorphous hard carbon film free of silicon oxide, the scuffing occurs at approximately 22 MPa. In the case of amorphous hard carbon film containing silicon oxide, however, the scuffing does not occur at the maximum load of 25 MPa.

In the amorphous hard carbon film, which contains silicon, a part of silicon is not bonded in the form of carbide. Such silicon is subjected to oxidation by means of addition of oxygen in trace amount into the amorphous hard carbon film. The silicon oxide is chemically stable The resultant amorphous hard carbon film demonstrates the lower friction coefficient and hence less friction loss than of the amorphous hard carbon film without silicon oxide.

SUMMARY OF EXAMPLES

As is described hereinabove, metal oxide can be easily formed in the amorphous hard carbon film by means of adding a trace amount of oxygen or an oxygen-containing compound during film decreases the friction coefficient approximately one-quarter. The friction coefficient does not increase and is stable even in the initial sliding stage.

Such expensive heat-resistant materials as Ni or Co based material need not be used for the automobile parts and parts of household electric appliances operated under severe sliding conditions. The amorphous hard carbon film, which contains metal oxide, can be formed around room temperature. The substrate material, therefore, is not thermally deformed and dimensional accuracy is not impaired during the film formation on the portion of a sliding member to be in sliding or thrusting contact with the opposite member. The amorphous hard carbon film, which contains metal oxide, is uniform and firmly adheres to the substrate.

The wear resistance and scuff resistance of the sliding member are outstandingly enhanced. The friction loss of the sliding portions of a piston ring, a vane and a plunger are reduced due to low frictional property and high hardness of the film. The durability of these parts is prolonged.

In addition, since the metal oxide, which decreases the friction coefficient, is in advance contained in the film, low friction coefficient can be obtained in a case under vacuum and non-oxidation atmosphere.

What is claimed is:

1. A composite film comprising:

amorphous hard carbon composed mainly of carbon and hydrogen, and containing a silicon carbide and a silicon oxide, characterized in that the atomic % of the silicon bonded with carbon is greater than that of the silicon bonded with oxygen.

2. A composite film according to claim 1, wherein the carbide is SiC and the oxide is $SiO_x$.

3. A composite film according to claim 1, wherein the atomic % of the silicon in terms of total atomic % of the composite film is less than 4 atomic %.

* * * * *